United States Patent
Kim et al.

(10) Patent No.: US 7,674,534 B2
(45) Date of Patent: Mar. 9, 2010

(54) ELECTROMAGNETIC WAVE SHIELDING FILTER, METHOD OF MANUFACTURING THE SAME, PDP APPARATUS INCLUDING THE SAME FILTER

(75) Inventors: Eui-soo Kim, Daegu Metropolitan (KR); Kyeong-keun Woo, Seoul (KR); Jeong-hong Oh, Bucheon-si (KR); Tae-soon Park, Suwon-si (KR)

(73) Assignee: Samsung Corning Co., Ltd., Gyeonggi-do (KR)

( * ) Notice: Subject to any disclaimer, the term of this patent is extended or adjusted under 35 U.S.C. 154(b) by 953 days.

(21) Appl. No.: 11/242,770

(22) Filed: Oct. 4, 2005

(65) Prior Publication Data

US 2006/0083938 A1 Apr. 20, 2006

(30) Foreign Application Priority Data

Oct. 18, 2004 (KR) .................. 10-2004-0083184

(51) Int. Cl.
*B32B 15/04* (2006.01)
*B32B 9/00* (2006.01)
*G02B 5/28* (2006.01)
*C03C 17/36* (2006.01)

(52) U.S. Cl. .................. 428/701; 427/96.3; 428/469; 428/472.1; 313/112; 313/489

(58) Field of Classification Search .......... 428/469, 428/472.2, 701, 702; 427/96.3; 313/112, 313/489, 681
See application file for complete search history.

(56) References Cited

U.S. PATENT DOCUMENTS

| 2002/0075203 | A1 | 6/2002 | Woodruff et al. |
| 2003/0094016 | A1 | 5/2003 | Duffy et al. |
| 2005/0095449 | A1* | 5/2005 | Yanagisawa et al. ........ 428/689 |
| 2007/0281178 | A1* | 12/2007 | Oh et al. ..................... 428/469 |

FOREIGN PATENT DOCUMENTS

EP  1 043 606 A1  10/2000
KR  10-1997-0073950 A  12/1997

OTHER PUBLICATIONS

European Search Report, issued in corresponding European Patent Application No. 05256391.3-2208, dated on Oct. 30, 2007.

* cited by examiner

*Primary Examiner*—John J. Zimmerman
*Assistant Examiner*—Aaron Austin
(74) *Attorney, Agent, or Firm*—McDermott Will & Emery LLP

(57) ABSTRACT

An electromagnetic wave shielding filter that has low electric conductivity, high visible light transmittance and good durability, a method of manufacturing the electromagnetic wave shielding filter, and a PDP apparatus including the electromagnetic wave shielding filter. The electromagnetic wave shielding filter includes a laminate structure including multiple stacks each consisting of a niobium oxide layer, a first protective layer having a ZnO as a main component, and a metal layer sequentially laminated in that order, the multiple stacks formed by repeatedly laminating the respective layers at least three times, and a niobium oxide layer formed on the laminate structure.

9 Claims, 4 Drawing Sheets

ELECTROMAGNETIC WAVE SHIELDING FILTER, METHOD OF MANUFACTURING THE SAME, PDP APPARATUS INCLUDING THE SAME FILTER

This application claims priority from Korean Patent Application No. 10-2004-0083184 filed on Oct. 18, 2004, in the Korean Intellectual Property Office, the disclosure of which is incorporated herein in its entirety by reference.

BACKGROUND OF THE INVENTION

1. Field of the Invention

The present invention relates to an electromagnetic wave shielding filter, a method of manufacturing the same and a plasma display panel ("PDP") apparatus including the same. More particularly, the present invention relates to an electromagnetic wave shielding filter which has low electric conductivity, high visible light transmittance and good durability, a method of manufacturing the same and a PDP apparatus including the same.

2. Description of the Related Art

As modem society becomes more information-oriented, photoelectronic devices and apparatuses are advancing and are becoming more widespread. In particular, image display devices are being widely used in a variety of applications, including TV screens, monitors of personal computers, etc. Wide screens and a thin build have become the mainstream technology along with the progress of high performance image display devices.

The plasma display panel (PDP) is gaining popularity as a next-generation display device to replace the CRT because a PDP is thin and a large screen can be readily fabricated with a plurality of units. A PDP apparatus includes a plasma display panel on which an image is displayed using a gas discharge phenomenon, and exhibits superior display capabilities, including high display capacity, high brightness, high contrast, clear latent image, a wide viewing angle, etc.

In a PDP apparatus, when a direct current (DC) or alternating current (AC) voltage is applied to electrodes, a discharge of gas plasma is created, resulting in the emission of ultraviolet (UV) light. The UV emission excites adjacent phosphor materials, resulting in electromagnetic emission of visible light.

Despite the above advantages, PDPs face several challenges associated with driving characteristics, including an increase in electromagnetic wave radiation, near-infrared emission, and phosphor surface reflection, and an obscured color purity due to orange light emitted from helium (He) or xenon (Xe) used as a sealing gas.

The electromagnetic wave and near-infrared ray generated in PDPs may adversely affect human bodies and cause malfunction of precision machines such as wireless telephones or remote controllers. Thus, in order to make use of such PDPs, there is a desire to reduce the electromagnetic wave and near-infrared ray emitted from the PDPs to a predetermined level or less. In this respect, various PDP filters have been proposed for shielding electromagnetic waves or near-infrared rays emitted from the PDPs, reducing reflection of light and/or enhancing color purity. The proposed PDP filters are also required to meet transmittance requirements because the filters are installed on a front surface of each of the PDPs.

In order to reduce the electromagnetic wave and Near-Infrared Ray (NIR) emitted from plasma display panels to a predetermined level or less, various PDP filters have been used for the purposes of e.g., shielding electromagnetic waves or NIR emitted from the PDPs, reducing reflection of light and/or enhancing color purity. High transmittance is required for such filters because they are generally applied to the front surface of PDPs. Typical electromagnetic wave shielding filters meeting such requirements and characteristics are classified into a metal mesh-pattern filter and a transparent conductive film filter. Although the metal mesh-pattern filter exhibits a good electromagnetic wave shielding effect, it has several disadvantages including poor transmittance, image distortion, and an increase in the production cost due to a costly mesh.

Due to such disadvantages, electromagnetic wave shielding filters using transparent conductive films using indium tin oxide (ITO) are being widely used instead of the metal mesh-pattern filter. The transparent conductive film is generally formed of a multi-level thin film structure in which a metal film and a high-refractive-index transparent thin layer are sandwiched. Silver or a silver-based alloy may be used as the metal film.

One example of the multi-level thin film structure for use in the conventional electromagnetic wave shielding filters is disclosed in Korean Patent Application No. 1997-20914, entitled, "Transparent Laminate and Optical Filter for Display Using Same," filed in May 27, 1997.

The disclosed technology has a sequentially and alternately stacked structure of three thin layers comprised of silver or a silver alloy and three high-index-refractive transparent, thin layers. Here, the high-refractive-index transparent thin layers are comprised of indium oxide and the metal thin layer is comprised of silver or a silver alloy.

In conventional electromagnetic wave shielding filters using the laminate structure, decrease of sheet resistance is achieved by increasing the number of metal thin layers in the laminate structure. However, there are problems that the increase of the number of metal thin layers leads to low visible light transmittance while enhancing sheet resistance, an increase in the production cost, and low manufacturability.

Further, the conventional electromagnetic wave shielding filters have a disadvantage because the metal thin layers generally comprised of silver are vulnerable to chemicals and easily eroded. Various attempts have been made to prevent erosion of metallic thin films. However, no successful solution has yet been proposed due to some environmental factors.

SUMMARY OF THE INVENTION

The present invention provides an electromagnetic wave shielding filter that has low electric conductivity, high visible light transmittance rays and superior durability.

The present invention also provides a method of manufacturing the electromagnetic wave shielding filter.

The present invention also provides a PDP apparatus including the electromagnetic wave shielding filter.

According to an aspect of the present invention, there is provided an electromagnetic wave shielding filter including a electromagnetic wave shielding filter including a laminate structure including multiple stacks each consisting of a niobium oxide layer, a first protective layer having a ZnO as a main component, and a metal layer sequentially laminated in that order, the multiple stacks formed by repeatedly laminating the respective layers at least three times, and a niobium oxide layer formed on the laminate structure.

According to another aspect of the present invention, there is provided an electromagnetic wave shielding filter including a laminate structure including multiple stacks each consisting of a niobium oxide layer, a first protective layer having a ZnO as a main component, and a second protective layer sequentially laminated on a substrate in that order, the multiple stacks formed by repeatedly laminating the respective layers at least three times, and a niobium oxide layer formed on the laminate structure.

According to still another aspect of the present invention, there is provided a method of manufacturing an electromagnetic wave shielding filter, the method including preparing a laminate structure including multiple stacks each consisting of a niobium oxide layer, a first protective layer ZnO as a main component, and a metal layer sequentially laminated on a substrate in that order, the multiple stacks formed by repeatedly laminating the respective layers at least three times, and forming a niobium oxide layer on the laminate structure.

According to still another aspect of the present invention, there is provided a PDP apparatus including the electromagnetic shielding filter.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
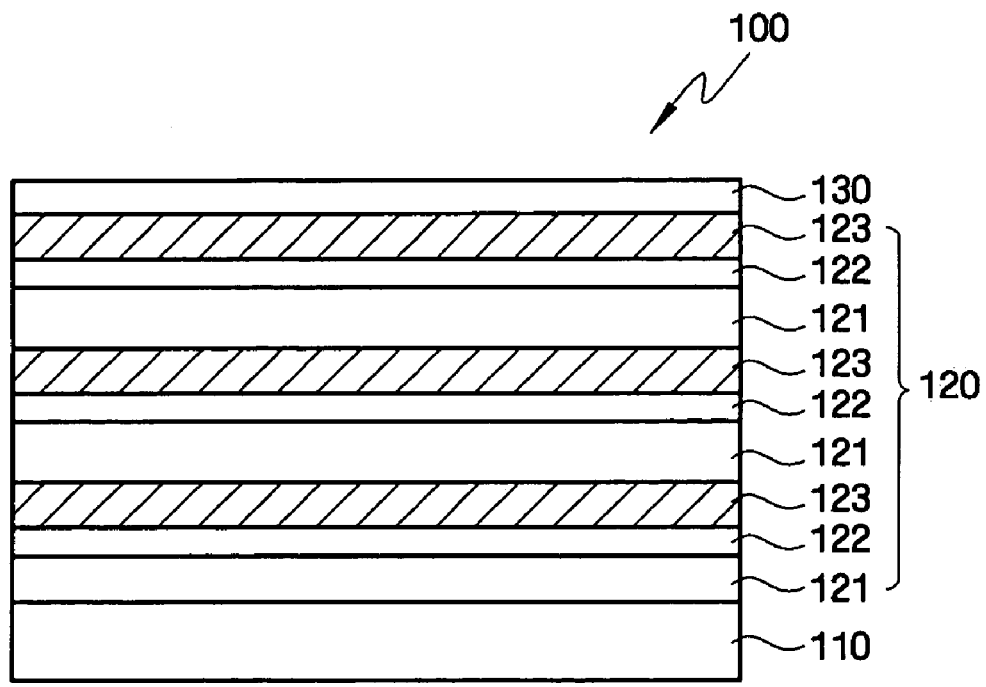
FIGS. 1 and 2 are sectional views illustrating electromagnetic wave shielding filters according to embodiments of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Hereinafter, electromagnetic wave shielding filters according to embodiments of the present invention will be described with reference to FIG. 1 and FIG. 2.

FIG. 1 is a sectional view illustrating an electromagnetic wave shielding filter according to one embodiment of the present invention.

Referring to FIG. 1, an electromagnetic wave shielding filter 100 according to a first embodiment of the present invention includes a substrate 110, a laminate structure 120, and a niobium oxide layer 130.

The substrate 110 is not specifically limited but includes a plastic film such as polyethyleneterephthalate (PET), a plastic sheet such as acryl resin, and the like. The substrate 110 may be a glass substrate, a plastic film, a plastic sheet used for use in a display, and the like. Particularly, the substrate 110 may be transparent. The laminate structure 120 is disposed on a surface of the substrate 110 and includes multiple stacks each consisting of a niobium oxide layer 121, a protective layer 122 and a metal layer 123 sequentially laminated in that order, the multiple stacks formed by repeatedly laminating the respective layers at least three times.

The niobium oxide layer 121 of the laminate structure 120 may be niobium oxide ($Nb_2O_5$) only, or niobium oxide ($Nb_2O_5$) plus a trace element. The trace element may be Ti, Cr or Zr.

The composition of the niobium oxide layer 121 of the laminate structure 120 may be the same with or different from that of the other niobium oxide layer 121.

The niobium oxide layer 121 has a thickness in a range of 15 to 80 nm. Particularly, in a case of the niobium oxide layer 121 that is formed adjacent to the substrate 110, the niobium oxide layer 121 preferably has a thickness in a range of 15 to 40 nm. From the viewpoint of increasing the wavelength range in which reduced visible light transmittance and low reflectance are achieved, it is preferable that the niobium oxide layer 121 that is adjacent to the substrate 110 is about half as thick as the other niobium oxide layers 12.

The protective layer 122 containing zinc oxide (ZnO) as a main component is formed on the niobium oxide layer 121. The protective layer 122 serves to protect the metal layer 123 formed thereon, thereby enhancing the durability of the filter. In addition, the protective layer 122 increases electric conductivity of the metal layer 123, thereby enhancing the electromagnetic wave shielding effect of the filter. The protective layer 122 is comprised of aluminum zinc oxide (AZO), which contains zinc oxide (ZnO) as a main component and Al or $Al_2O_3$ as a trace element. The ratio of ZnO:$Al_2O_3$ is in a range of about 90:10 to 99.9:0.1, but is not limited thereto.

The composition of the protective layer 122 of the laminate structure 120 may be the same as or different than that of the other protective layer 122.

In addition, the protective layer 122 prevents surface plasmon from being generated at an interfacial surface between the niobium oxide layer 121 and the metal layer 123, thereby reducing visible light loss in the laminate structure 120 due to light absorption by the surface plasmon. Further, the protective layer 122 increases the wavelength range in which visible light transmittance is reduced and low reflectance is achieved. In this respect, the protective layer 122 preferably has a thickness in a range of 1 to 10 nm.

The metal layer 123 is formed on the protective layer 122. The metal layer 123 is comprised of silver or a silver alloy containing about 90 wt % of Ag. Silver has high flexibility and electric conductivity, and maintains its electric conductivity during a thin film forming process. Silver has further advantages in that it is relatively less expensive than other metals and has low absorptivity of visible light. Silver is also advantageous because of its high formability. Despite the above stated advantages, silver has a limitation to be used in the metal layer for an electromagnetic wave shielding filter because it is vulnerable to chemicals. However, in accordance with the first embodiment of the present invention, silver is used as the metal layer 123 for the electromagnetic wave shielding filter 100 without degrading the durability of the electromagnetic wave shielding filter by forming the protective layer 122 on one side of the metal layer 123.

The composition of the metal layer 123 of the laminate structure 120 may be the same as or different than that of the other metal layer 123.

The metal layer 123 may be formed to a thickness in a range of 7 to 20 nm. From the viewpoint of increasing the wavelength range in which reduced visible light transmittance and low reflectance are achieved, the metal layer 123 closest to the substrate 110 and the metal layers 123 farthest from the substrate 110 are formed thinner, approximately 0.5 to 1.0 times the thickness of the other metal layers 123.

The niobium oxide layer 130 is formed on the above-described laminate structure 120. The niobium oxide layer 130 may be comprised of niobium oxide only, or niobium oxide plus a trace element. The trace element may be Ti, Cr, Zr, Bi, Al, or B.

An appropriate thickness of the niobium oxide layer 130 formed on the laminate structure 120 is in the range of 15 to 40 nm with a view to increasing the wavelength range, which is required for reducing the visible light transmittance and achieving low reflectance.

Figure 2:
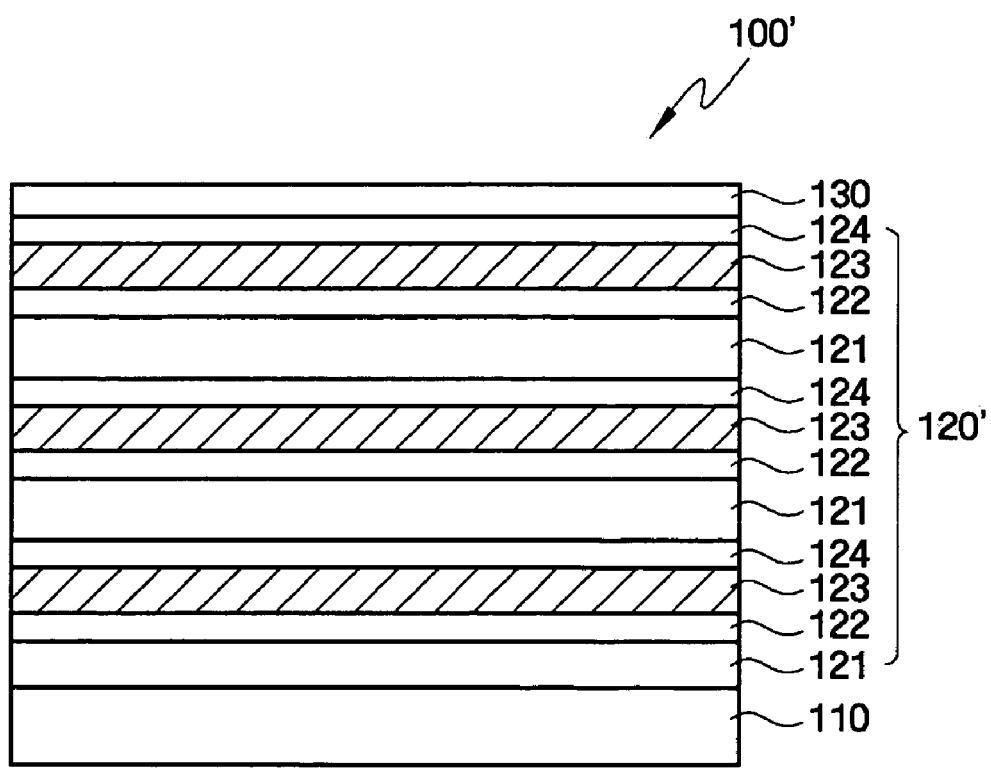

FIG. 2 is a sectional view illustrating an electromagnetic wave shielding filter 100' according to another embodiment of the present invention.

Referring to FIG. 2, the electromagnetic wave shielding filter 100' according to the second embodiment of the present invention includes a substrate 110, a laminate structure 120' and a niobium oxide layer 121.

The substrate 110 and the niobium oxide layer 121 in the electromagnetic wave shielding filter 100' according to the second embodiment of the present invention are the same as the corresponding elements of the electromagnetic wave shielding filter 100 according to the first embodiment of the present invention. However, the electromagnetic wave shielding filter 100' according to the second embodiment of the present invention and the electromagnetic wave shielding filter 100 according to the first embodiment of the present invention are different in that the laminate structure 120' includes multiple stacks each consisting of a niobium oxide layer 121, a protective layer 122, a metal layer 123, and an additional protective layer 124 sequentially laminated in that order, the multiple stacks formed by repeatedly laminating the respective layers at least three times. That is, the protective layer 124 may further be provided on the metal layer 123. The protective layer 124 acts as a blocker for preventing extinction of electric conductivity of the metal layer 123 due to oxygen plasma created during formation of the niobium oxide layer 121 in a subsequent step. That is, oxygen plasma may cause damage to the previously formed metal layer, the oxygen plasma employed for the purpose of forming the niobium oxide layer 121 using a direct current (DC) sputtering method after forming the metal layer 123. Accordingly, the protective layer 124 comprised of AZO or ITO is needed to prevent the damage caused to the previously formed metal layer.

The composition of the protective layer 124 of the laminate structure 120' may be the same as or different than that of the other protective layer 124.

In addition, the protective layer 124 prevents surface plasmon from being generated at an interfacial surface between the metal layer 123 and the niobium oxide layer 121, thereby reducing visible light loss in the laminate structure 120' due to light absorption by the surface plasmon. Further, the protective layer 124 increases a wavelength range in which visible light transmittance is reduced and low reflectance is achieved. In this respect, the protective layer 124 preferably has a thickness in a range of 1 to 10 nm.

A method of manufacturing electromagnetic wave shielding filters 100 and 100' in accordance with first and second embodiments of the present invention will be described with reference to FIG. 3.

Figure 3:
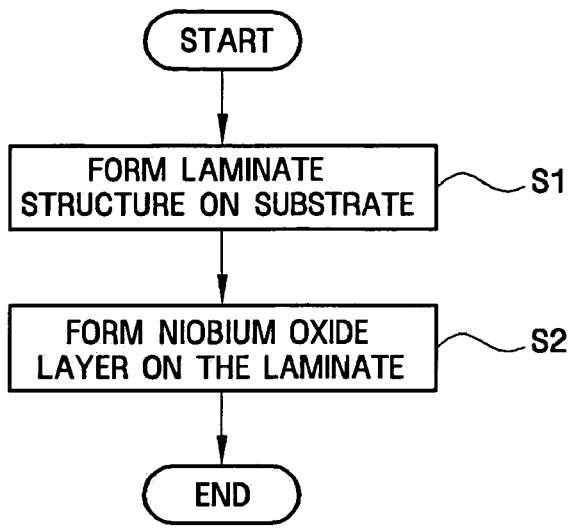
FIG. 3 is a flowchart showing a method of manufacturing electromagnetic wave shielding filters according to the embodiments of the present invention.

FIG. 3 is a flowchart showing a method of manufacturing an electromagnetic wave shielding filter 100 according to the present invention.

Referring to FIGS. 1 and 3, the laminate structure 100 is formed on the substrate 110 in step S1. Here, the laminate structure 100 includes multiple stacks each consisting of the niobium oxide layer 121, the protective layer 122 and the metal layer 123 sequentially laminated in that order, the multiple stacks formed by repeatedly laminating the respective layers at least three times.

Referring first to FIG. 1, to form the laminate structure 100, the niobium oxide layer 121 is first formed on the substrate 110. The niobium oxide layer 121 can be formed by a DC sputtering method using a niobium oxide target with excellent electric conductivity, a reactive sputtering method, an ion plating method, a physical vapor deposition method or a chemical vapor deposition method. Particularly, the DC sputtering method is preferably used because the niobium oxide layer 121 can be rapidly deposited while achieving uniformity in thickness over a large area.

The niobium oxide target is a target prepared by making oxygen deficient relative to the stoichiometric composition of niobium oxide or by adding other material to the target, so that the target has electric conductivity, which is high enough to use with a DC sputtering method. In the former case, an inert gas containing 0.1 to 10 vol % of an oxidative gas is preferably used as a sputtering gas. When the inert gas containing the oxidative gas having a concentration within the range stated above is used as the sputtering gas, oxidation of the metal layer 123 due to oxidative plasma generated during the formation of the niobium oxide layer 121 can be effectively inhibited. In addition, the laminate structure 120 having low emissivity and high electric conductivity can be effectively prepared. In particular, an inert gas containing 0.1 to 5 vol % of an oxidative gas is preferably used as a sputtering gas.

An oxygen gas may generally be used as the oxidative gas. Examples of the useful oxidative gas include nitrogen monoxide, nitrogen dioxide, carbon monoxide, carbon dioxide, ozone, and the like. In this case, the niobium oxide layer 121 may be formed to a thickness of 15 to 40 nm.

Next, the protective layer 122 comprised of AZO containing ZnO as a main component on the niobium oxide layer 121. The protective layer 122 can be formed by a method appropriately selected depending on the stoichiometric composition of a potential layer to be formed. For example, the method includes a sputtering method, a CVD method and a vapor deposition method.

In case that the protective layer 122 comprised of AZO is formed by sputtering using a target containing ZnO as a main component and $Al_2O_3$ as a trace element, an additional oxidative gas supply is not necessary. That is, the protective layer 122 is formed using the target only. AZO does not reduce transmittance of the protective layer 122 even without additional oxidative gas. That is, the protective layer 122 can be formed without using the oxidative gas such as oxygen ($O_2$). Accordingly, oxidation of the metal layer 123, caused by the oxidative gas during formation of the metal layer 123, does not occur.

Here, the thickness of the protective layer 122 may be in a range of 1 to 10 nm.

Next, the meal layer 123 is formed on the protective layer 122. The metal layer 123 may be comprised of silver or a silver alloy by a sputtering method, a CVD method or a vapor deposition method. Particularly, the metal layer 123 is preferably formed by a DC sputtering method in order to ensure a high deposition rate and achieve uniformity in thickness over a large area.

In this case, the thickness of the metal layer 123 is preferably in a range of 7 to 20 nm.

The niobium oxide layer 121, the protective layer 122 and the metal layer 123 are repeatedly laminated at least three times by the same method in the same order as described above, thereby forming the laminate structure 120. Here, a thickness of the layers other than the niobium oxide layer 121 adjacent to the substrate 110 in the laminate structure 120 may be in a range of 30 to 80 nm.

Next, a niobium oxide layer 130 is formed on the laminate structure 120 in step S2. The niobium oxide layer 130 is formed by a DC sputtering method using a reductive niobium oxide target, a reactive sputtering method, an ion plating method, a vapor deposition method, or a CVD method. Specifically, the DC sputtering method using a reductive niobium oxide target is preferably used because the niobium oxide layer 130 can be formed at a high deposition rate while achieving good uniformity in thickness over a large area. Since oxidation of the metal layer 123 is prevented, visible light transmittance of the electromagnetic wave shielding filter 100 can be enhanced and reflectance thereof can be reduced. In this case, the niobium oxide layer 130 may be formed to a thickness of 15 to 40 nm.

A method of manufacturing the electromagnetic wave shielding filter 100' according to the second embodiment of the present invention will be described below with reference to FIGS. 2 and 3.

The laminate structure 120' is formed on the substrate 110 in step S1. Here, the laminate structure 120' includes multiple stacks each consisting of the niobium oxide layer 121, the protective layer 122, the metal layer 123, and the protective layer 124 sequentially laminated in that order, the multiple stacks formed by repeatedly laminating the respective layers at least three times.

Referring back to FIG. 2, to form the laminate structure 120', the niobium oxide layer 121 is first formed on the substrate 110. The niobium oxide layer 121 can be formed by a DC sputtering method. Particularly, the DC sputtering method is preferably used.

Here, the niobium oxide layer 121 may be formed to a thickness of 15 to 40 nm.

Next, the protective layer 122 is formed on the niobium oxide layer 121. The protective layer 122 may be comprised of aluminum zinc oxide (AZO), which contains zinc oxide (ZnO) as a main component. The protective layer 122 can be formed by a method appropriately selected depending on the stoichiometric composition of a potential layer to be formed. For example, the method includes a sputtering method, a CVD method, a PVD method, and the like.

In a case of forming the protective layer 122 comprised of AZO is formed by sputtering using a target containing ZnO as a main component and $Al_2O_3$ as a trace element, an additional oxidative gas supply is not necessary. That is, the protective layer 122 is formed using the target only. AZO does not reduce transmittance of the protective layer 122 even without additional oxidative gas. That is, the protective layer 122 can be formed without using the oxidative gas such as oxygen ($O_2$). Accordingly, oxidation of the metal layer 123 due to presence of an oxidative gas generated during formation of the metal layer 123 does not occur.

Here, the thickness of the protective layer 122 may be in a range of 1 to 10 nm.

Next, the metal layer 123 is formed on the protective layer 122. The metal layer 123 may be comprised of silver or a silver alloy. The metal layer 123 may be formed by a sputtering method, a CVD method or a PVD method. Particularly, the metal layer 123 is preferably formed by a DC sputtering method to ensure a high deposition rate and to achieve uniformity in thickness over a large area.

In this case, the thickness of the metal layer 123 is preferably in a range of 7 to 20 nm.

Next, the protective layer 124 is further formed on the metal layer 123. The protective layer 124 is comprised of AZO or ITO by an appropriately selected according to the stoichiometric composition of a potential layer to be formed. For example, the method includes a sputtering method, a CVD method, a PVD method, and the like.

In this case, the protective layer 124 may be formed to a thickness in a range of 10 to 20 nm.

The niobium oxide layer 121, the protective layer 122, the metal layer 123, and the protective layer 124 are repeatedly laminated at least three times by the same method in the same order as described above, thereby forming the laminate structure 120'. Here, a thickness of the layers other than the niobium oxide layer 121 adjacent to the substrate 110 in the laminate structure 120' may be in a range of 30 to 80 nm.

Next, a niobium oxide layer 130 is formed on the laminate structure 120' in step S2. The forming of the niobium oxide layer 130 is preferably performed by a DC sputtering method using a reductive niobium oxide target, a reactive sputtering method, an ion plating method, a PVD method, or a CVD method. Here, the niobium oxide layer 130 is preferably formed to a thickness in a range of 15 to 40 nm.

The present invention will be described in detail through the following concrete experimental examples. However, the experimental examples are for illustrative purposes and are not to be construed as limiting the scope of the invention.

EXPERIMENTAL EXAMPLE 1

First, Ar (200 sccm) and $O_2$ (80 sccm) were used as sputtering gases and DC power of 25 kW was applied thereto, forming a 5 nm thick $Nb_2O_5$ layer on a substrate, e.g., a transparent glass substrate.

Next, an AZO layer was formed on the $Nb_2O_5$ layer to a thickness of about 5 nm using an aluminum zinc oxide (AZO) target, which contains zinc oxide (ZnO) as a main component and about 1% $Al_2O_3$, and Ar (200 sccm) as a sputtering gas, while applying DC power of 1 kW to the target.

Then, Ar (150 sccm) was used as a sputtering gas and DC power of 1.6 kW power was applied thereto, forming an Ag layer on the AZO layer to a thickness of about 12 nm.

Next, an ITO target having $InO_3$ containing about 10% $SnO_2$ was used as a target, and Ar (200 sccm) and $O_2$ (80 sccm) were used as sputtering gases, forming an ITO layer to a thickness of about 5 nm on the Ag layer.

Subsequently, a 56 nm thick $Nb_2O_5$ layer, a 5 nm thick AZO layer, a 14 nm thick Ag layer, and a 5 nm thick ITO layer were sequentially formed. Then, a laminate structure consisting of a 56 nm thick $Nb_2O_5$ layer, a 5 nm thick AZO layer, a 12 nm thick Ag layer, and a 5 nm thick ITO layer, was prepared. Finally, a $Nb_2O_5$ layer having a thickness of 28 nm was formed on the laminate structure, thereby completing an electromagnetic wave shielding filter.

EXPERIMENTAL EXAMPLE 2

An electromagnetic wave shielding filter was manufactured in the same manner as in Experimental Example 1 except that a protective layer formed on an Ag layer was comprised of AZO. That is, the structure of the electromagnetic wave shielding filter prepared in this example was as follows: Substrate/$Nb_2O_5$ layer/AZO layer/Ag layer/AZO layer/Nb$_2$O$_5$ layer/AZO layer/Ag layer/AZO layer/Nb$_2$O$_5$ layer/AZO layer/Ag layer/AZO layer/Nb$_2$O$_5$ layer/.

COMPARATIVE EXAMPLE

An electromagnetic wave shielding filter was manufactured in the same manner as in Experimental Example 1 except that a protective layer formed on an Ag layer was comprised of ITO. That is, the structure of the electromagnetic wave shielding filter prepared in this example was as follows: Substrate/Nb$_2$O$_5$ layer/ITO layer/Ag layer/ITO layer/Nb$_2$O$_5$ layer/ITO layer/Ag layer/ITO layer/Nb$_2$O$_5$ layer/ITO layer/Ag layer/ITO layer/Nb$_2$O$_5$ layer/.

Measurement of Spectral Transmittance

Figure 4:
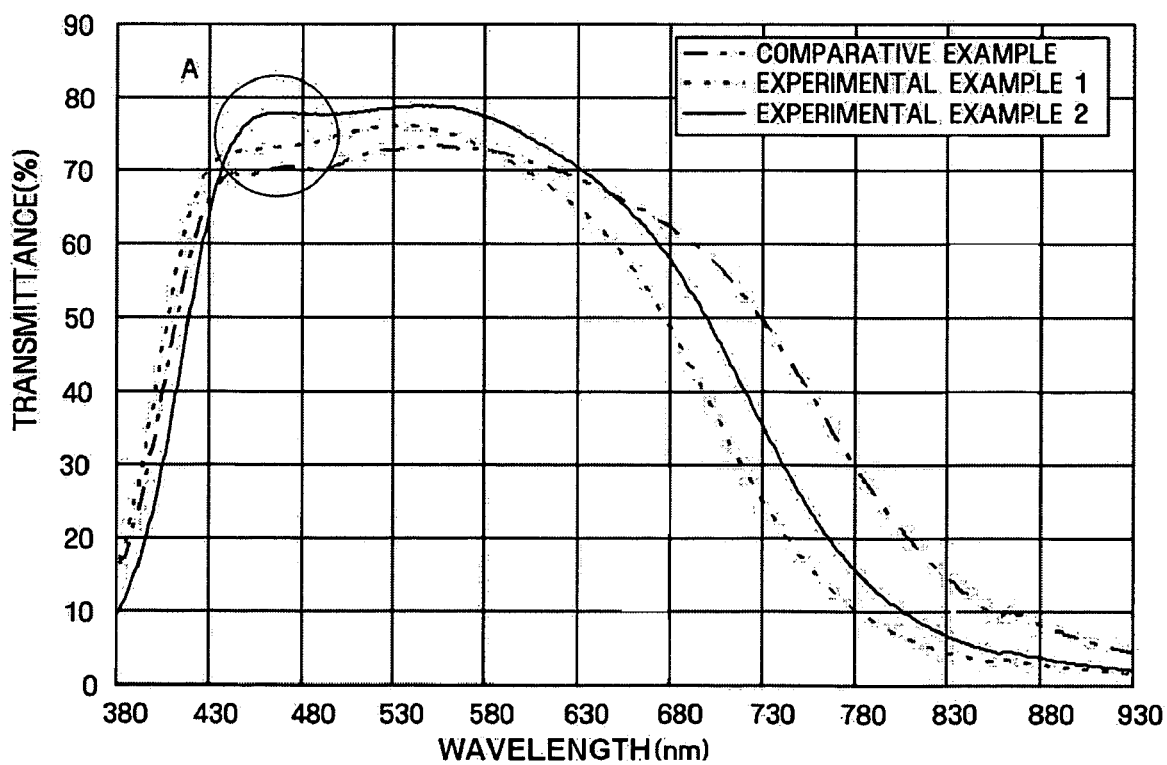
FIG. 4 is a graph showing spectral transmittance of samples according to Experimental Examples 1 and 2 and Comparative Example.

Spectral transmittance of the electromagnetic wave shielding filters manufactured according to the Experimental Examples 1 and 2 and the Comparative Example were measured in a wavelength region of 380 through 930 nm according to Japanese Industrial Standard (JIS) R3106 (see FIG. 4). Visible light transmittance (380 through 780 nm) was obtained by relative radiation efficiency of CIE Chromatic adaptation for CIE standard illuminants D$_{65}$ as specified in JIS Z8720.

Measurement of Sheet Resistance

Sheet resistance was measured using a 4-point proving method. The results are shown in Table 1.

Measurement of Moisture Resistance

Each two samples prepared in Experimental Examples 1 and 2 and the Comparative Example, having a size of 600× 1000 (mm) were placed under relative humidity 95% at a temperature of 60° C. for a predetermined time and then the number of spot defects caused to the sample pieces was visually observed. The results are shown in Table 1.

TABLE 1

|  | Experimental Example 1 | Experimental Example 2 | Comparative Example |
|---|---|---|---|
| Visible light transmittance | 75 | 77 | 72 |
| Sheet resistance (Ω/Sq.) | 1.2 | 1.1 | 1.5 |
| Number of defects | 0 | 0 | 2 |

As evident from Table 1, the samples prepared in Experimental Examples 1 and 2 had better visible light transmittance, sheet resistance and moisture resistance than those prepared in Comparative Example.

Referring to FIG. 4, the samples prepared in Experimental Examples 1 and 2 had higher visible light transmittance in a blue color area (area A in FIG. 4) than those prepared in Comparative Example because light absorption by the samples is low in blue area. From the measurement results, it is seen that electromagnetic wave shielding filters according to the present invention would have high visible light transmittance over a wide wavelength range, thereby increasing degree of free in development of color control film.

Hereinafter, a PDP including the electromagnetic wave shielding filter according to embodiments of the present invention will be described.

Figure 5:
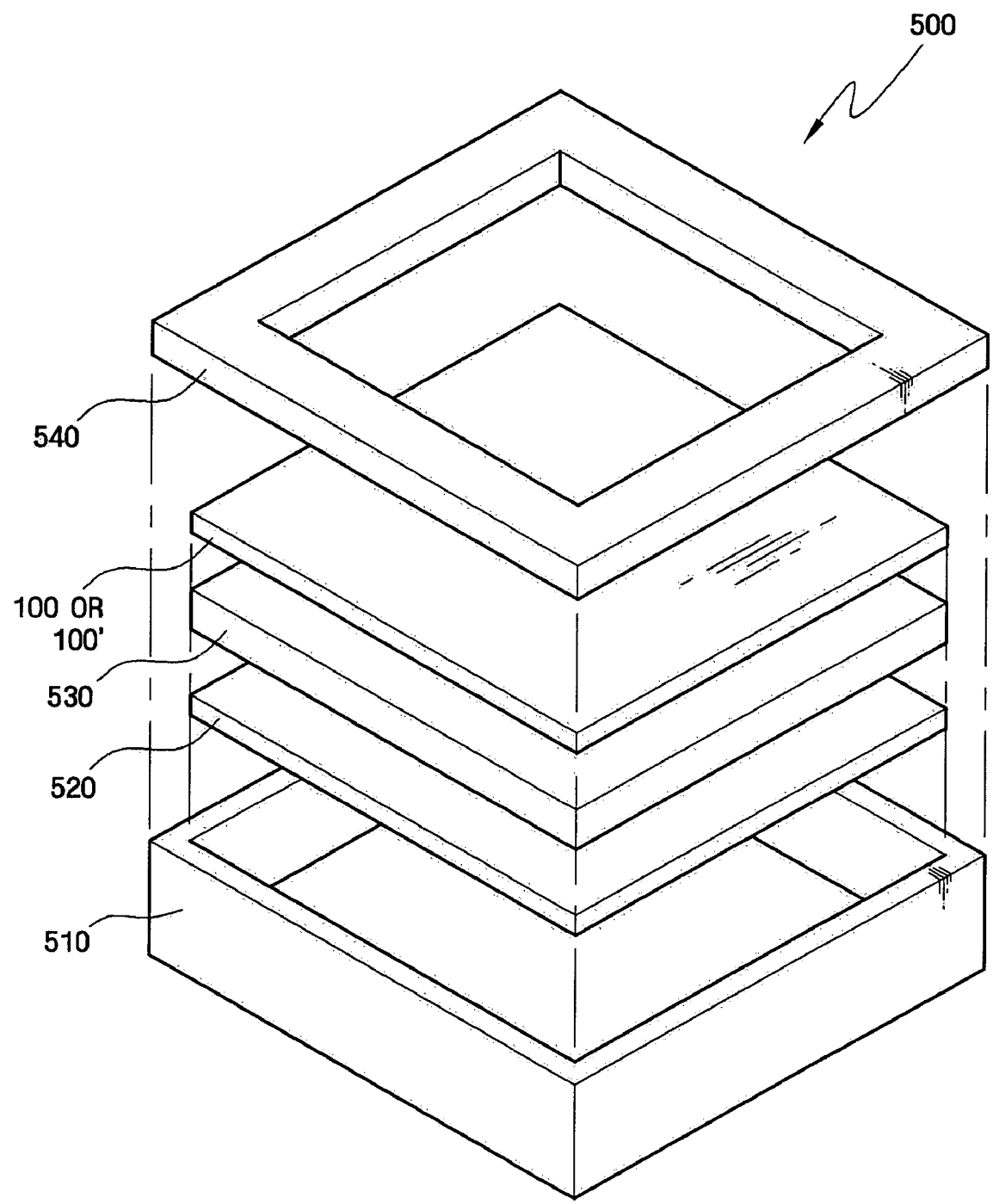
FIG. 5 is an exploded perspective view illustrating a PDP apparatus according to an embodiment of the present invention.

FIG. 5 is an exploded perspective view of a PDP apparatus in accordance with one embodiment of the present invention. Referring to FIG. 5, a PDP apparatus 500 includes a case 510, a cover 540 covering an upper surface of the case 510, a driving circuit board 520 received in the case 510, a panel assembly 530 including discharge cells in which a gas discharges occurs, and an electromagnetic wave shielding filter 100 or 100' according to embodiments of the present invention.

The electromagnetic wave shielding filter 100 or 100' includes a conductive layer comprised of a highly conductive material on a substrate. The conductive layer is grounded to the case 110 via the cover 150. That is, an electromagnetic wave generated from the panel assembly 530 is grounded to the cover 540 and the case 510 through the conductive layer of the electromagnetic wave shielding filter 100 or 100' before it reaches a viewer.

Figure 6:
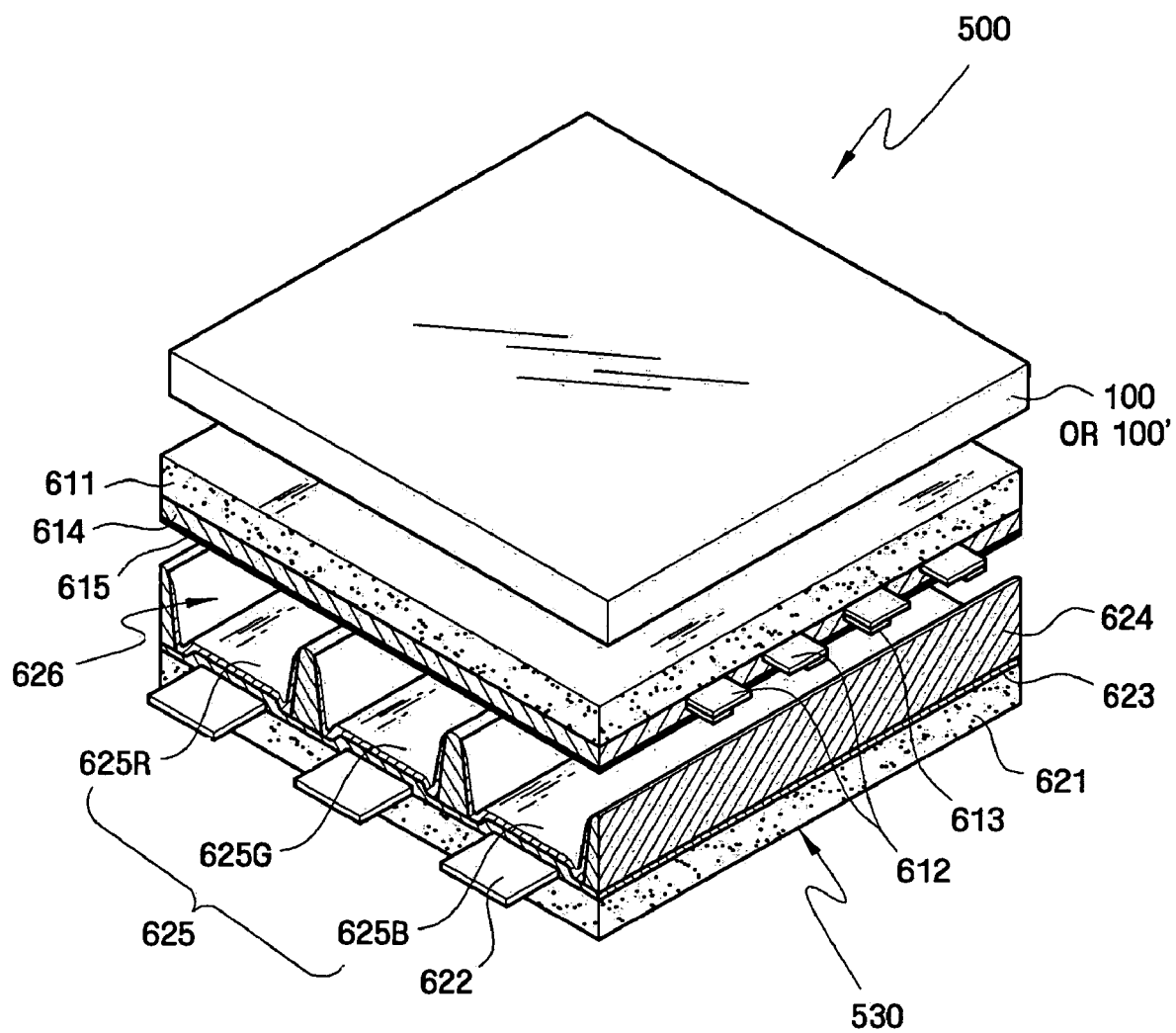
FIG. 6 is a perspective view illustrating a PDP apparatus including the electromagnetic wave shielding filter according to the present invention.

FIG. 6 is a perspective view illustrating a PDP apparatus 500 according to an embodiment of the present invention.

Referring to FIG. 6, the PDP apparatus 500 includes an electromagnetic wave shielding filter 100 or 100' and a panel assembly 530. The electromagnetic wave shielding filter 100 or 100' includes a laminate structure and a niobium oxide layer formed on the laminate structure. The laminate structure has multiple stacks each consisting of a niobium oxide layer, a protective layer, and a metal layer or a niobium oxide layer, a protective layer, a metal layer, and a protective layer sequentially laminated in that order, the multiple stacks formed by repeatedly laminating the respective layers at least three times, and having a sequentially stacked structure of three or more stacks of multi-layers, where each stack of multi-layers may include a niobium oxide layer, a protection and a metal layer or include a niobium oxide layer, a protective layer, a metal layer and a protective layer. Although not shown, the electromagnetic wave shielding filter 100 or 100' may further include a neon light-shielding layer, an NIR-shielding layer and an antireflection layer, and a combination layer having a neon light-shielding function, an NIR-shielding function and/ or an antireflection function.

Hereinafter, the panel assembly 530 will be described in detail.

Referring to FIG. 6, a plurality of sustain electrodes 612 are arranged in a striped pattern on a surface of a front substrate 611. Each of the plurality of sustain electrodes 612 includes a bus electrode 613 to reduce a signal delay. A dielectric layer 614 covers the entire surface of the plurality of sustain electrodes 612. A dielectric protective layer 615 is formed over the dielectric layer 614. That is, the dielectric protective layer 615 is formed by covering the surface of the dielectric layer 614 using a thin film comprised of MgO by sputtering, etc.

Meanwhile, a plurality of address electrodes 622 are arranged in a striped pattern on a substrate of a rear substrate 621 opposite to and facing the front substrate 611. The address electrodes 622 are formed to intersect with the sustain electrode pairs 612 when the front substrate 611 and the rear substrate 612 face each other. The address electrodes 622 are wholly covered with a dielectric layer 623. A plurality of barrier ribs 624 are formed on the dielectric layer 623 to be parallel to the address electrodes 622 and protrude toward the front substrate 611. The barrier ribs 624 are disposed between each of the respective adjacent address electrodes 622.

A phosphor layer 625 is formed on lateral surfaces of grooves defined by the barrier ribs 624 and the dielectric layer 623. The phosphor 625 includes a red phosphor layer 625R, a green phosphor layer 625G, and a blue phosphor layer 625B which are partitioned by the barrier ribs 624. The red phosphor layer 625R, the green phosphor 625G, and the blue phosphor layer 625B are respectively formed using red, green and blue phosphor particles by a thick film formation method, e.g., a screen printing method, an inkjet method or a photoresist film method. The red phosphor layer 625R, the green phosphor layer 625G, and the blue phosphor layer 625B may be comprised of (Y, Gd)BO$_3$:Eu, Zn$_2$SiO$_4$:Mn and BaMgAl$_{10}$O$_{17}$, respectively.

When the front substrate 611 and the rear substrate 612 are coupled to and face each other, discharge cells 626 are produced at intersections of the address electrodes 622 and the scan electrodes 612 disposed between the front substrate 611 and the rear substrate 612. Then, a discharge gas is injected into the discharge cells 626 defined by the grooves and the dielectric protective layer 615. A He—Xe gas or a He—Xe gas can be used as a discharge gas.

The panel assembly 530 emits light according to the same principle as a fluorescent lamp. UV light emitted from the discharge gas by discharge in the discharge cells 626 excites the phosphor layer 725, thereby emitting visible light.

The phosphor layers 625R, 625G and 625B are comprised of phosphor materials having different conversion efficiencies into visible light. Thus, a color balance adjustment for image display in the panel assembly 130 is generally performed by adjusting the brightness of the red phosphor layer 725R, the green phosphor layer 725G, and the blue phosphor layer 725B. In detail, based on a phosphor layer with the lowest brightness, the brightness of the other phosphor layers is lowered according to a predetermined ratio.

The driving of the panel assembly 130 is largely performed by address discharge and sustain discharge. The address discharge occurs between the address electrodes 622 and one of the sustain electrode pairs 612, in which wall charges are generated. The sustain discharge occurs by a potential difference created between two electrodes of each sustain electrode pair positioned in the discharge cells 626 where wall charges are generated. During the sustain discharge, the phosphor layer 625 of the discharge cells 626 in which wall charges are generated is excited by UV light emitted from a discharge gas, so that visible light is emitted. The visible light is emitted via the front substrate 611, thereby forming a visually recognizable image.

The electromagnetic wave shielding filter, the method of manufacturing the electromagnetic wave shielding filter and the PDP apparatus including the electromagnetic wave shielding filter according to the present invention provide at least the following advantages.

First, the electromagnetic wave shielding filter has a protective layer comprised of AZO, thereby enhancing durability by protecting the metal layer against chemicals and moisture.

Second, the AZO protective layer has high visible light transmittance in comparison with the conventional ITO protective layer.

Third, the electromagnetic wave shielding filter has low sheet resistance, enhancing electromagnetic wave shielding or interfering efficiency.

Fourth, the electromagnetic wave shielding filter has high transmittance for blue regions of visible light, thereby increasing degree of freedom in development of a color conditioning film.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. An electromagnetic wave shielding filter comprising:
a laminate structure including multiple stacks, each stack consisting of a niobium oxide layer, a first protective layer having ZnO as a main component, and a metal layer sequentially laminated on a substrate in that order, where the multiple stacks are formed by repeatedly laminating the respective layers at least three times; and adjacent stacks are in direct contact with each other and wherein the niobium oxide layer of the one stack among the multiple stacks is in direct contact with the substrate; and
a niobium oxide layer formed on the laminate structure.

2. The electromagnetic wave shielding filter according to claim 1, wherein the first protective layer is comprised of aluminum zinc oxide (AZO).

3. The electromagnetic wave shielding filter according to claim 1, wherein the metal layer is comprised of silver or a silver alloy.

4. The electromagnetic wave shielding filter according to claim 1, wherein the niobium oxide layer has a thickness in a range of 15 to 80 nm, the first protective layer has a thickness in a range of 1 to 10 nm and the metal layer has a thickness in a range of 7 to 20 nm.

5. The electromagnetic wave shielding filter according to claim 1, wherein the niobium oxide layer on the substrate and the niobium oxide layer of the laminate structure have both a thickness in a range of 15 to 40 nm.

6. The electromagnetic wave shielding filter according to claim 1, having a sheet resistance of 1.4Ω/Sq. or less.

7. The electromagnetic wave shielding filter according to claim 1, having visible light transmittance of 65% or greater.

8. A plasma display panel (PDP) apparatus including the electromagnetic shielding filter according to claim 1.

9. A method of manufacturing an electromagnetic wave shielding filter, comprising the steps of:
preparing a laminate structure including multiple stacks, each stack consisting of a niobium oxide layer, a first protective layer ZnO as a main component, and a metal layer sequentially laminated on a substrate in that order, where the multiple stacks are formed by repeatedly laminating the respective layers at least three times and adjacent stacks are in direct contact with each other, and wherein the niobium oxide layer of the one stack among the multiple stacks is in direct contact with the substrate; and
forming a niobium oxide layer on the laminate structure.

* * * * *